United States Patent
Meloni

(10) Patent No.: US 10,679,832 B2
(45) Date of Patent: Jun. 9, 2020

(54) MICROWAVE PLASMA SOURCE

(71) Applicant: Verity Instruments, Inc., Carrollton, TX (US)

(72) Inventor: Mark A. Meloni, Carrollton, TX (US)

(73) Assignee: Verity Instruments, Inc., Carrollton, TX (US)

(*) Notice: Subject to any disclaimer, the term of this patent is extended or adjusted under 35 U.S.C. 154(b) by 0 days.

(21) Appl. No.: 16/022,389

(22) Filed: Jun. 28, 2018

(65) Prior Publication Data

US 2019/0013187 A1 Jan. 10, 2019

Related U.S. Application Data

(60) Provisional application No. 62/530,589, filed on Jul. 10, 2017.

(51) Int. Cl.
| | |
|---|---|
| *H01J 37/32* | (2006.01) |
| *H01L 21/67* | (2006.01) |
| *H01L 21/3065* | (2006.01) |
| *H01L 21/66* | (2006.01) |

(52) U.S. Cl.
CPC .. *H01J 37/32972* (2013.01); *H01J 37/32174* (2013.01); *H01L 21/3065* (2013.01); *H01L 21/67069* (2013.01); *H01L 21/67253* (2013.01); *H01L 22/26* (2013.01)

(58) Field of Classification Search
None
See application file for complete search history.

(56) References Cited

U.S. PATENT DOCUMENTS

| 4,906,900 A | | 3/1990 | Asmussen | |
|---|---|---|---|---|
| 5,885,402 A | * | 3/1999 | Esquibel | H01J 37/32935 156/345.24 |

(Continued)

FOREIGN PATENT DOCUMENTS

| CN | 103258706 A | 8/2013 |
|---|---|---|
| JP | 2-295052 A | 12/1990 |

(Continued)

OTHER PUBLICATIONS

Moisan, et al.; "Plasma sources based on the propagation of electromagnetic surface waves"; Review Article; J. Phys. D: Appl. Phys. 24; Departement de Physique, Universite de Montreal; Jul. 11, 1990; 24 pgs.

(Continued)

*Primary Examiner* — Robert K Carpenter

(57) ABSTRACT

The disclosure provides a plasma source, an excitation system for excitation of a plasma, and a method of operating an excitation measurement system. In one embodiment, the plasma source includes: (1) a coaxial radio frequency (RF) resonator including a first end, a second end, an inner electrode and an outer electrode, (2) a radio frequency interface electrically coupled to the inner and outer electrode and configured to provide an RF signal to the coaxial RF resonator, (3) a flange positioned at the first end of the resonator and defining a plasma cavity, and (4) a window positioned between the first end of the resonator and the flange, and forming one side of the plasma cavity, whereby the coaxial RF resonator is isolated from the plasma.

23 Claims, 5 Drawing Sheets

FIG. 4A

(56) References Cited

U.S. PATENT DOCUMENTS

| | | | | |
|---|---|---|---|---|
| 2002/0135761 A1* | 9/2002 | Powell | ............... | G01J 3/02 |
| | | | | 356/316 |
| 2006/0144520 A1* | 7/2006 | Fink | ............... | B08B 7/0035 |
| | | | | 156/345.48 |
| 2012/0211466 A1* | 8/2012 | Choi | ............... | H01J 37/3211 |
| | | | | 216/68 |
| 2013/0115781 A1 | 5/2013 | Matsumoto et al. | | |
| 2015/0053346 A1 | 2/2015 | Matsumoto et al. | | |
| 2016/0284516 A1 | 9/2016 | Ikeda et al. | | |
| 2017/0303380 A1* | 10/2017 | Zindler | ............... | G21B 1/21 |

FOREIGN PATENT DOCUMENTS

| | | |
|---|---|---|
| JP | 9-115694 A | 5/1997 |
| JP | 2001-148372 A | 5/2001 |
| JP | 2004-266268 A | 9/2004 |
| JP | 2013-77441 A | 4/2013 |
| JP | 2013-118398 A | 6/2013 |
| KR | 10-1997-0028874 | 6/1997 |
| KR | 1020040010898 A | 2/2004 |
| KR | 1020080101968 A | 11/2008 |
| KR | 20110020702 A | 3/2011 |
| KR | 1020110020723 A | 3/2011 |
| KR | 1020120081246 A | 7/2012 |
| TW | 201123999 A | 7/2011 |
| TW | 201346973 A | 11/2013 |

OTHER PUBLICATIONS

Kogelschatz; "Fundamentals and Applications of Dielectric-Barrier Discharges"; ABB Corporate Research Ltd.; May 24, 2000; 7 pgs.

Bilgic, et al.; "Design and modelling of a modified 2.45 GHz coaxial plasma torch for atomic spectrometry"; Technical note; Spectrochimica Acta Part B; Elsevier; Oct. 2, 1997; 5 pgs.

* cited by examiner

MICROWAVE PLASMA SOURCE

CROSS-REFERENCE TO RELATED APPLICATION

This application claims the benefit of U.S. Provisional Application Ser. No. 62/530,589, filed by Mark A. Meloni on Jul. 10, 2017, entitled "MICROWAVE PLASMA SOURCE," commonly assigned with this application and incorporated herein by reference.

TECHNICAL FIELD

This application is directed, in general, to monitoring semiconductor processes and, more specifically, to optically monitoring processes via excitation of process gasses and observation of optical signals.

BACKGROUND

Selectively removing or depositing materials from a semiconductor wafer to form integrated circuit structures from wafers is well known in the art of semiconductor processing. Removal of material from a semiconductor wafer is accomplished by employing some type of etching process, such as, reactive ion etching and plasma etching. Depositing material on a wafer may involve processes such as chemical and physical vapor deposition, and molecular beam epitaxy. Other removal and deposition processes are also known. Such processes are tightly controlled and are often performed in a sealed process chamber.

Because exact amounts of material must be deposited onto or removed from the semiconductor wafer, its progress must be continually and accurately monitored to precisely determine the stopping time or endpoint of a particular process. Optically monitoring the process is one very useful tool for determining the stage or endpoint for an ongoing process. For instance, gasses within the interior of the process chamber may be optically monitored for certain known emission lines by spectrally analyzing predetermined wavelengths of light emitted or reflected from the wafer in the chamber. Conventional methods include optical emission spectroscopy (OES), absorption spectroscopy, reflectometry, etc.

A customary way to monitor the optical spectrum in semiconductor plasma process tools is to use an optical monitoring system which consists of an array-based optical spectrometer, and an optical coupling system to bring the light from the plasma in the interior of the chamber to the spectrometer. The optical spectrum is typically recorded as a series of light intensity measurements in a set of narrow spectral bands or over a broad spectrum, typically repeated at specific time intervals.

SUMMARY

In one aspect, the disclosure provides a plasma source for excitation of a plasma from one or more gasses and optical monitoring thereof. In one embodiment, the plasma source includes: (1) a coaxial radio frequency (RF) resonator including a first end, a second end, an inner electrode and an outer electrode, (2) a radio frequency interface electrically coupled to the inner and outer electrode and configured to provide an RF signal to the coaxial RF resonator, (3) a flange positioned at the first end of the resonator and defining a plasma cavity, and (4) a window positioned between the first end of the resonator and the flange, and forming one side of the plasma cavity, whereby the coaxial RF resonator is isolated from the plasma.

In another aspect, the disclosure provides an excitation system for excitation of a plasma. In one embodiment, the excitation system includes: (1) a plasma source, having (1A) a coaxial radio frequency (RF) resonator including a first end, a second end, an inner electrode and an outer electrode, (1B) a radio frequency interface electrically coupled to the inner and outer electrode and configured to deliver an RF signal to the coaxial RF resonator, (1C) a flange positioned at the first end of the coaxial RF resonator and defining a plasma cavity, and (1D) a window positioned between the first end of the coaxial RF resonator and the flange, and forming one side of the plasma cavity, whereby the coaxial RF resonator is isolated from the plasma, and (2) a source controller configured to provide the RF signal to the RF interface and control an amount of power of the RF signal.

In yet another aspect, the disclosure provides a method of operating an excitation measurement system. In one embodiment, the method includes: (1) igniting a plasma, from one or more gasses within a process chamber, within a plasma cavity of a plasma source, (2) maintaining the ignited plasma as an excited plasma, and (3) collecting optical signals from the excited plasma for processing.

BRIEF DESCRIPTION OF THE DRAWINGS

The disclosure may be understood by reference to the following detailed description taken in conjunction with the drawings briefly described below.

DETAILED DESCRIPTION

Measurement of plasma light within a chamber as the plasma reacts with the semiconductor wafer can be difficult in some applications. Specifically when the process gas within the chamber is excited remotely from the wafer and considerable time is required for the excited reactants to interact with the wafer surface the amount of optical emission is very limited or non-existent. In these applications, measurements from the light of the plasma even if obtainable do not provide an accurate characterization of the process at the semiconductor wafer since the plasma emission may not contain emissions from the reactions occurring on the wafer surface. Similarly, in semiconductor processes that do not utilize plasmas there are obviously not optical emissions to observe. Discussions and examples herein refer to plasma-based processes and processing chambers but it should be understood that the various embodiments of the disclosure may be used with any type of system where excitation of process gas and optical monitoring of the excitations may be performed.

It is realized herein that an excitation of the process gas or gasses (herein referred to in some following descriptions as process gas for ease of discussion) proximate to a wafer or in other relevant or convenient locations in a process chamber is often needed to generate light for optical monitoring of certain known emission lines or broad spectral features emitted from the ongoing reactions in the chamber. The disclosure provides a solution for excitation of plasma and monitoring the optical spectrum resulting from the excitation. The disclosure provides a plasma source that is designed to receive a radio frequency (RF) signal and provide an electromagnetic (EM) field as a excitation source of the process gas in, for example, a process chamber.

The disclosed plasma source reduces the complexity of the existing technologies and provides maximum process compatibility. The plasma source decouples the process volume and the operating conditions of the source. The plasma source includes a coaxial radio frequency resonator that is primarily outside of the process volume and has reduced impacts from process gas species, pressure loadings and other interactions compared to existing designs. The coaxial RF resonator is combined with projected EM fields to provide robust operation with isolation of the process volume and external ambient environments. The plasma source can include a ¾-wave or ¼-wave resonant plasma source device.

Figure 2:
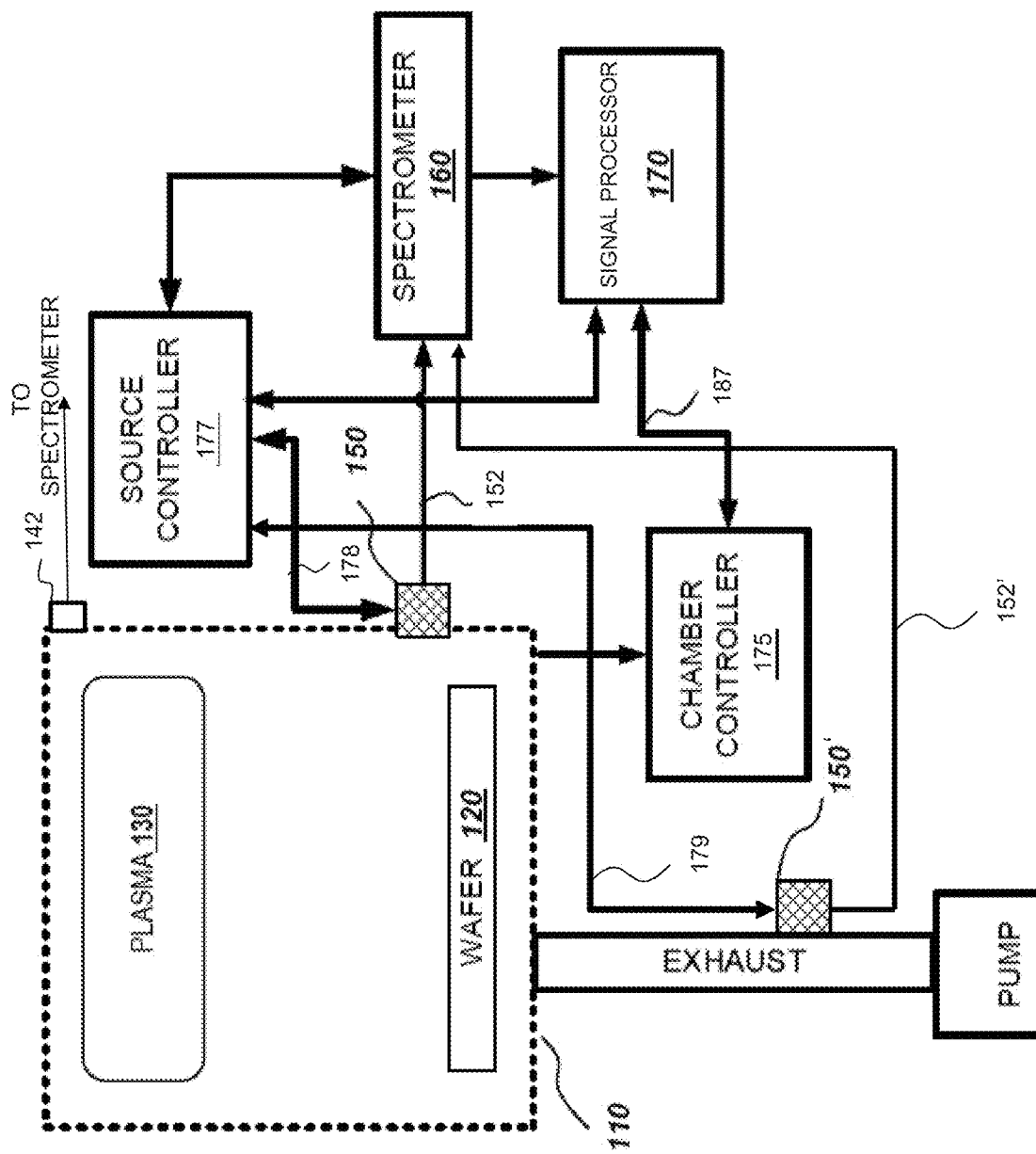
FIG. 2 illustrates a block diagram of an embodiment of a process system employing a plasma source for excitation and monitoring.

One of the benefits of the plasma source is the minimized interaction with the process space. The process space is a volume that includes the process gas. For example, the process space can be within a process chamber or an exhaust line. As such, the process space can be before, proximate, or after the process gas interacts with a wafer. The purpose or target of optical monitoring performed at a process space can vary depending on the location of the process space. For example, if the process space is located before interaction of the process gas with a wafer, the optical monitoring can be for appropriate decomposition of reactants or existence of certain reactants. If proximate, the optical monitoring can be for changes in composition of the process gas resulting from interaction of the process gas and the wafer. If after, the optical monitoring can also be for changes in the process gas composition with a compensation for time. This time-delayed optical monitoring allows for the collisions of different states of metastable compounds. Examples of locations before, proximate, and after correspond to the locations of optical interface 142, plasma source 150, and plasma source 150', respectively, as illustrated in FIG. 2. Many of the components of the plasma source can be isolated from the process space. For example, only a mounting flange, a window, and an o-ring can be in contact with the process space and associated process gasses. This isolation reduces potential contamination and adverse interaction with the process occurring in the chamber. The plasma source provides additional benefits such as maximized compatibility of materials with the process gasses. The plasma source is also operable in a wide pressure range, is suitable for multiple process types, and is operable for various monitoring applications, including process chambers and foreline operations. An example of the wide pressure range is approximately 1E-4 to 10 Torr in typical process gasses. The plasma source can advantageously have a compact form factor of, for example, approximately 100 mm×35 mm×35 mm (L×W×H) excluding cables and electronics. In some embodiments, the plasma source is conveniently designed for mounting to conventional KF40 interfaces. The plasma source can also be mounted to other conventional or even proprietary interface designs, such as interfaces with or for process chambers or forelines.

The disclosed plasma source allows ease of maintenance with a simplified design for easy preventative maintenance (PM) cycles and a plasma wetted window that provides "self-cleaning" for reduced clouding and signal variation. The plasma source is constructed to allow optical monitoring of the process side of the window. An optical fiber can be placed within the plasma source for the optical monitoring at the window. Further advantages are that the plasma source can be used at low power, and employ small drive electronics and other accessory items. The plasma source can be constructed of aluminum or other metals, and can be constructed of a combination of materials including aluminum.

The disclosed plasma source provides various advantages for optical monitoring of gasses present in a process chamber. These advantages include a minimum interaction with a process space of a processing chamber, a foreline, etc. The plasma source also provides a limited material interaction with the process chemistry within the process space and is robust to changes in the process gas and pressure. The coaxial design of the plasma source can also provide observation at the interaction location within a process chamber and delivery of the obtained optical signals to an optical measurement system.

Figure 1:
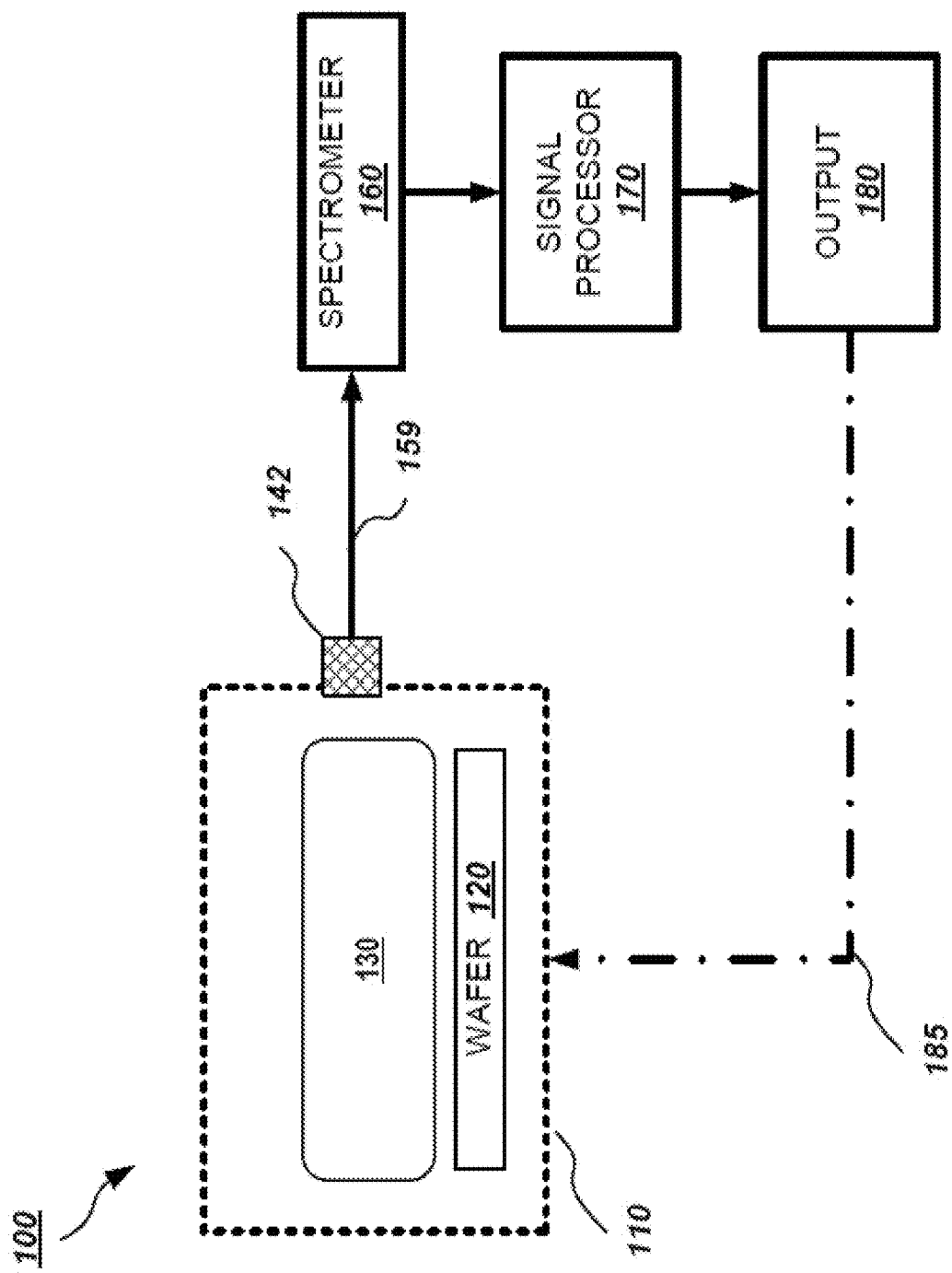
FIG. 1 illustrates a block diagram of a prior art process system utilizing OES to monitor and/or control the state of a plasma process within a process tool.

Turning now to the figures, FIG. 1 illustrates a block diagram of a process system 100 utilizing OES to monitor and/or control the state of a plasma process within a process tool or chamber 110. The shown and described components are well known in the industry and simplified for expedience. The process chamber 110, such as a semiconductor process chamber, generally encloses a wafer 120 and possibly process plasma 130 in a typically partially evacuated volume which may include various process gases. Process chamber 110 may include one or multiple optical interfaces, such as optical interface 142, to permit observation into the process chamber 110 at various locations and orientations. Optical interface 142 may be a viewport or may additionally include multiple types of optical elements such as, but not limited to, lenses, windows, apertures, fiber optics, mirrors, and optical wavelength filters.

In process system 100, process gas within the process chamber 110 is excited proximate wafer 120 employing conventional means. For OES applications, optical interface 142 may be oriented to collect light emissions from plasma 130. Fiber optic cable assembly 159 may direct any collected light, also referred to as optical signals, to spectrometer 160. Multiple optical interfaces may be used separately or in parallel to collect OES related optical signals. For example, another interface may be located to collect emission from near the surface of wafer 120 while optical interface 142 may be located to view the bulk of the plasma, as shown in FIG. 1. Other interfaces, not shown, may be located up-stream or down-stream of the plasma/wafer interface.

In some applications, a plasma source such as disclosed herein can be used to provide optical signals at the various locations of optical interfaces, such as optical interface 142. Accordingly, the process system 100 can include a plasma source controller such as the source controller 177 of FIG. 2. In FIG. 2, the optical interface 142 is included to provide an example of multiple optical monitoring locations of a process space, which monitoring may include different optical signals either directly observed or excited by a plasma source such as described herein and then observed. Furthermore, the observation of the optical signals may be performed by the same or different spectrometers.

After receiving the optical signals via the fiber optic cable assembly 159, the spectrometer 160 detects and converts the optical signals to electrical signals and then sends the electrical signals to signal processor 170. The spectrometer 160 can amplify and digitize the electrical signals before sending the electrical signals to signal processor 170. The signal processor 170 may be, for example, an industrial PC, PLC or other computer or computer system which employs one or more algorithms to produce an output that corresponds to the optical signals collected from the observed process within the process chamber 110. The algorithm can be an OES algorithm that analyzes emission intensity signals at predetermined wavelength(s) and determines trend parameters that relate to the state of a process and can be used to access that state, for instance end point detection, etch depth, etc. The output from the signal processor 170 can be, for example, an analog or digital control value representing the intensity of a specific wavelength or the ratio of two wavelength bands. Output values 180 may be transferred to process chamber 110 via communication link 185 for monitoring and/or modifying the production process occurring within the process chamber 110. Instead of a separate device, the signal processor 170 can be integrated with spectrometer 160.

FIG. 2 illustrates a block diagram of an embodiment of a process system 200 employing a plasma source for excitation and monitoring. In process system 200, process gas within the processing chamber 110 is excited remotely from the wafer 120 (a conventional means can be employed for the excitation). By the time that the excited reactants interact with the surface of the wafer 120 the amount of optical emission is very limited or non-existent. In these applications, measurements from the light of plasma 130, even if obtainable, do not provide an accurate characterization of the etching process of the semiconductor wafer 120 since the emission from the plasma 130 may not contain emissions from the reactions occurring on the surface of the wafer 120.

Accordingly, the process system 200 advantageously employs a plasma source, denoted as element 150 in FIG. 2, to provide optical signals for observation. The plasma source 150 can be located attached to the processing chamber 110 via a viewport near the wafer 120 such as used by optical interface 142 in FIG. 1 or at other or even multiple locations which provide interaction with the process gas. A window of the viewport is removed when the plasma source 150 is attached such that process gas is permitted within a plasma cavity of the plasma source 150. As discussed herein, the plasma source 150 can include optical elements positioned within plasma source 150 that are or are part of an optic cable assembly 152 that directs collected light obtained at the window of the plasma source to the spectrometer 160. Alternatively, a plasma source (element 150') can be located on an exhaust line of the system 200 as illustrated in FIG. 2 with optical cable assembly 152'. The optical cable assemblies 152 and 152' can include the same components as the optical cable assembly 159. In some embodiments, more than one plasma source can be employed in different locations of the process system 200 to provide independent RF plasma sources and monitoring devices. In such embodiments, each plasma source would have a corresponding spectrometer input port for delivering the obtained optical signals to the spectrometer for measurement.

In addition to the spectrometer 160 and signal processor 170 as shown in FIG. 1, the process system 200 also includes a chamber controller 175 and a source controller 177. The chamber controller 175 can be configured to direct operation of the processing chamber 110 by receiving monitoring data via a communication link 187 from the signal processor 170 or the spectrometer 160 via the signal processor 170 and control the plasma processing of the processing chamber 110 based thereon.

Source controller 177 can communicate with the chamber controller 175 to receive information such as process settings, gas types, gas pressures, etc., as well as plasma source control parameters of at least RF power level and frequency. The source controller 177 is also configured to provide the RF power to the plasma sources 150, 150'. The source controller 177 can be an RF signal source that provides a frequency signal to a coaxial RF resonator of the plasma sources 150, 150' via an RF interface. The source controller 177 can, for example, provide a nominal frequency of 2.45 GHz within the 2.4-2.5 GHz ISM band or other frequencies. Typically, the frequency is constant or narrowly variable and the amount of power supplied can be controlled manually or automatically. The source controller 177 can also vary the RF power for ignition or in response to external commands as described herein. As such, the source controller 177 can be coupled to the spectrometer 160 and the signal processor 170 to alter the power for delivering the RF signal to the plasma sources 150, 150'. The source controller 177 can also be used to automatically control the amount of power or the center frequency of the RF signal supplied to a coaxial RF resonator of the plasma sources 150, 150', via the cables 178, 179, respectively. The source controller 177 can include the necessary logic circuitry, software, combination of circuitry and software, etc., for controlling the RF signal.

The power capacity of the RF signal provided by the source controller 177 can vary depending on how the process gas is ignited. Ignition of the process gas can require a 100 watt power source. However, after ignition a power source an order smaller, such as a 0.1 to 10 watt power source, can be used to maintain the plasma. Optionally, a spark igniter proximate the window can be used for the initial excitation. As such, the required power source can be a 10 watt power source. Reducing the capacity of the power source can reduce the overall cost of employing the plasma source 150, 150'.

Figure 3:
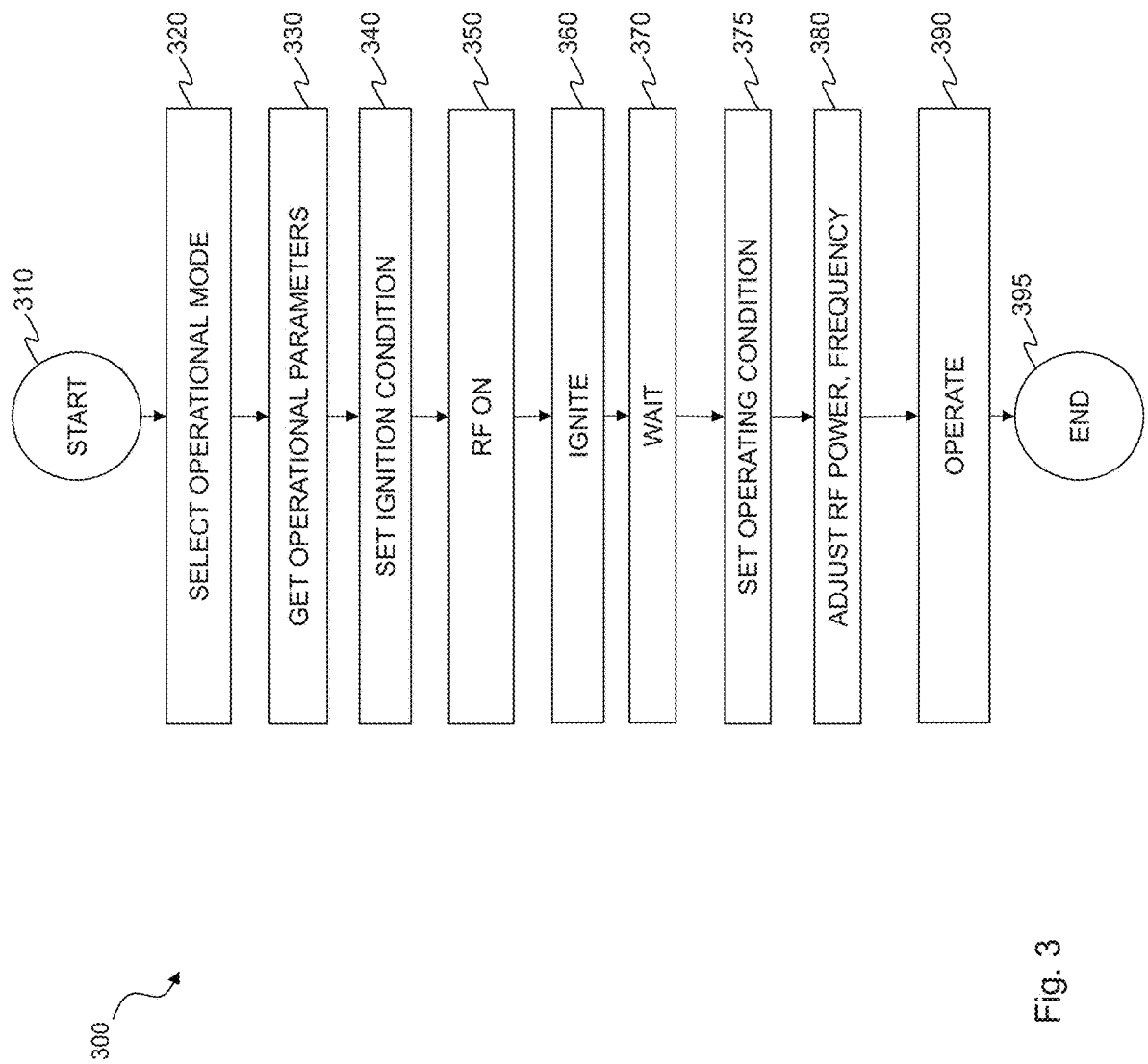
FIG. 3 illustrates a method of operating an excitation and monitoring system carried out according to the principles of the disclosure.

FIG. 3 illustrates a method 300 of operating an excitation measurement system carried out according to the principles of the disclosure. The method 300 can be used to direct the operation of at least a portion of, for example, the process system 200. The method 300 employs a plasma source as disclosed herein and starts in step 310.

In a step 320, an operational mode is selected. The operational mode can be specific for the plasma source or can be based on the operational mode of a process chamber. The operational mode can be the same for both the plasma source and the process chamber. The operational mode may be based upon gas type, gas pressure, optical signals of interest, etc., and generally includes values for parameters, such as RF power level and frequency, and required timing of any variations of these parameters. The operational mode may also define a continuous or pulsed operation of the RF power to a coaxial RF resonator of the plasma source.

In a step 330, operational parameters are obtained. The operational parameters can be obtained from a tool controller that directs the operation of the process tool or another source, such as spectrometer 160 and signal processor 170 of FIG. 2 or from a process engineer or semiconductor "fab" connected system. In a step 340, one or more conditions are set for igniting the plasma source. Conditions may include the setting of a high Q sub-condition and a specific frequency and power level for ignition. For example, the Q of the coaxial RF resonator of the plasma source can be increased to intensify the EM field for ignition and then reduced after ignition. The changing of the Q can be done by a Q tuner. In one example, the Q tuner includes an electrical coil positioned around at least a portion of the plasma source containing a variable permittivity or permeability material such as ferrite, wherein tuning is performed by energizing the electrical coil. A controller, such as a source controller, can automatically apply current to the electrical coil during ignition and adjust the current after ignition. Other methods of Q adjustment are known in the art and may be used with the plasma source.

In a step 350, the RF source is turned on and RF power is applied to the resonator to create the desired EM field. In a step 360, process gas within the process chamber to which the plasma source is coupled is ignited employing the intense EM field near the window of the plasma source generated by the ignition conditions. After ignition, an amount of time is allowed in step 370 to allow for stabilization of the plasma. This amount of time can be approximately one second and can depend on the pressure and gas conditions within the chamber. Stabilization of the plasma can be observed, for example, by monitoring variations in the optical signal or forward/reflected RF power or phase. A fixed amount of time can also be used based on experimental or historical data. After the designated amount of time, an operational condition is set in a step 375 for the plasma source. For example, a low Q condition may be set for the RF resonator so that variations in process pressure and gas concentration have less impact on the performance of the plasma source. The RF power and frequency are checked and adjusted in a step 380. Changes in the process chamber conditions such as pressure or gas concentrations may require changes to RF power levels, frequency and cavity Q to maintain consistent excitation and optical measurement performance. Thereafter, excitation and measurement occurs in a step 390. During this operating step 390, the plasma source may be configured to have a low Q to reduce the influence of changes in the pressure and process gas within the process chamber. The method 300 ends in a step 395.

Figures 4A, 4B:
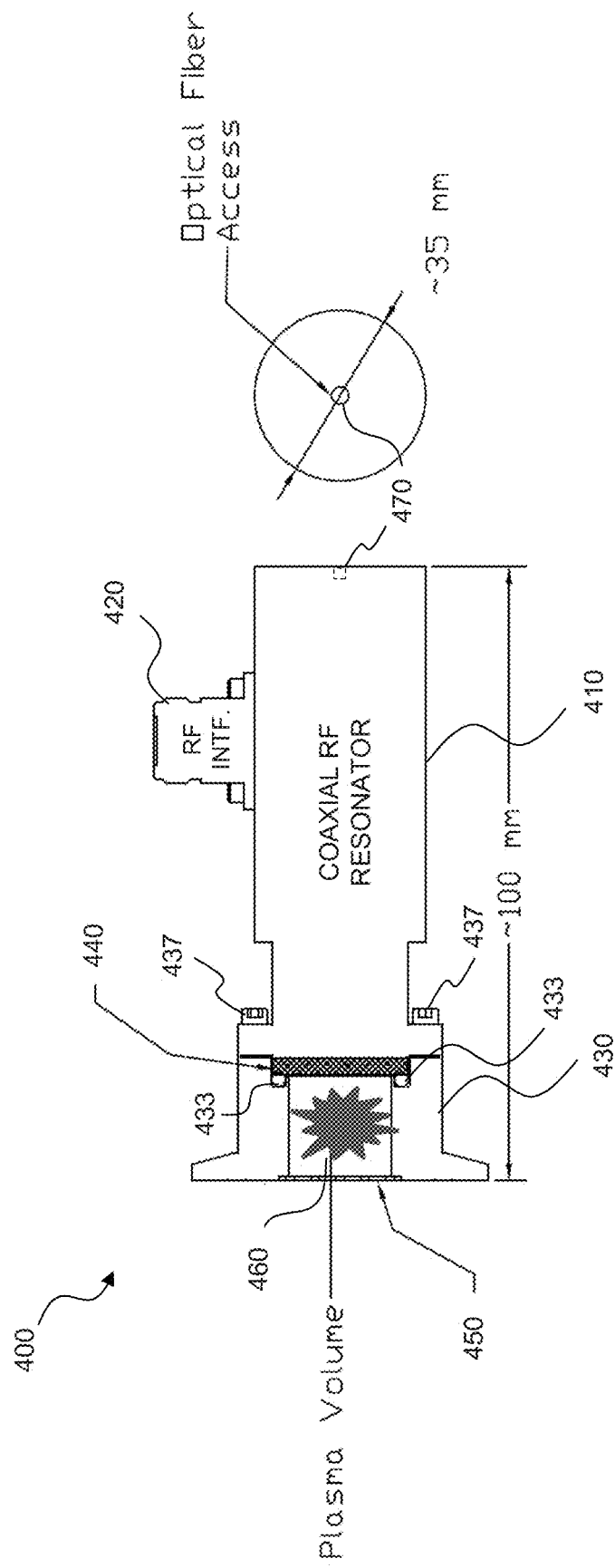
FIG. 4A illustrates a cross-sectional view diagram of an embodiment of a plasma source constructed according to the principles of the disclosure.
FIG. 4B illustrates an end view diagram of the plasma source illustrated in FIG. 4A.

FIG. 4A illustrates a cross-sectional view diagram of an embodiment of a plasma source 400 constructed according to the principles of the disclosure. The plasma source 400 includes a coaxial RF resonator 410, an RF interface 420, a flange 430, a window 440, an isolation screen 450, and a plasma cavity 460. In some embodiments, the dimensions of the coaxial RF resonator 410 are based on maximization of the EM field at the window 440 using an RF signal received via the RF interface 420. Maximization of the EM field at the window 440 can cause the resultant plasma wetting or non-wetting of the window thereby aiding, by sustaining an increased window temperature, self-cleaning of the window by action of the ignited plasma. Other dimensions of the coaxial RF resonator 410 are defined by wave length characteristics at the operating frequency of interest. The operating frequencies can be, but not required to be, within the Industrial, Scientific and Medical (ISM) bands, such as 2.4-2.5 GHz, 5.725-5.875 GHz, etc., due to international standardization for use and interference. In some ¾-wave embodiments, the plasma source 400 can be approximately 100 mm in length and the coaxial RF resonator 410 can be approximately 85.75 mm in length. Specific lengths depend upon the actual frequency of operation and the associated free-space wavelength of the RF waves. For example, for the 2.4-2.5 GHz ISM band the wavelengths range from 125 to 120 mm and a ¾-wave resonator is approximately 90 mm in length. Similarly a ¼-wave resonator is approximately 30 mm in length.

The coaxial RF resonator 410 is mechanically robust and designed to minimize emission of the RF signal received via the RF interface 420. The coaxial RF resonator 410 includes an inner electrode and an outer electrode (not shown in FIG. 4A). The RF interface 420 is electrically coupled to the inner and outer electrodes to provide excitation of the coaxial RF resonator 410 via the RF interface 420. The coaxial RF resonator 410 is designed to provide an intense electromagnetic (EM) field, generated by RF excitation, upon the process side of the window 440. As such, the process gas or plasma on the process space side of the window remains hot and contamination of the window 440 from the process gas is reduced. Accordingly, the disclosed plasma source 400 keeps the viewing window 440 for optical monitoring of a process space heated during excitation to reduce contaminates adhering to and damaging the window, i.e., a self-cleaning window.

The RF interface 420 is configured to couple the RF signal to the coaxial RF resonator 410. The RF signal can be within ISM band of frequencies and provided via a source controller, such as the source controller 177 of FIG. 2. In one embodiment, the RF signal has a nominal frequency of 2.45 GHz within the 2.4-2.5 GHz ISM band. The RF interface 420 is designed to match the impedance of the cable/source delivering the RF signal, such as the cables 178, 179, and the RF power source of the source controller 177 in FIG. 2. In some embodiments, the RF interface 420 is a 50 ohm type N or SMA connector.

The flange 430 is mechanically coupled to the coaxial RF resonator 410, with the window 440 and an o-ring 433 positioned therebetween, and the o-ring 433 positioned between the window 440 and the flange 430. Advantageously, the coaxial RF resonator 410 and the flange 430 are removably coupled together. The ability to easily disassemble and reassemble these components allows maintenance of the window 440 and the o-ring 433. Screws 437 or another type of fastener can be used for the removable, mechanical coupling of coaxial RF resonator 410 and flange 430. A process side of the flange 430 is configured to connect to an interface for viewing, such as an interface with a process chamber. The interface of the process side of the flange 430 can be a conventional type of connection. As noted above, the connection can comply with a KF40-style connector. As a further indication of the decoupling between the plasma source and the process volume; flange 430 may be modified with limited impact upon the operational characteristics of the plasma source. The o-ring 433 can be constructed of a material that is typically used in the industry to withstand the process gas, pressure, and heat. For example, the o-ring 433 can be Kalrez perflouroelastomer o-rings.

In addition to adapting to interfaces for mounting, the flange 430 mechanically supports the coaxial RF resonator 410 or body of the plasma source 400. The flange 430 can also support the isolation screen 450 if used. The isolation screen 450 includes openings or holes to allow the process gas into a plasma cavity 460 defined by the inner diameter of the flange 430. Isolation screen 450, furthermore, may inhibit migration of plasma excited near window 440 from entering the main portions of the attached process volume. The isolation screen 450 can be an optional component that is not used in some embodiments of the plasma source 400. The inner surfaces of the plasma cavity 460 which may be contacted by plasma and/or process gasses can be coated with zirconia, yttria, refractory oxide, or another similar product to reduce contamination and damage due to the process gas. The window 440 can also be constructed of a conventional material that is used to resist contamination due to the process gas. For example, the window 440 can be a sapphire window.

In addition to isolating the majority of the plasma source 400 from the process volume, the window 440 is for viewing the optical spectrum generated by excitation of a plasma volume in the plasma cavity 460. As stated above, one side of the window 440 is in contact with the environment of a process space, the other side is conveniently at ambient conditions. An optical fiber can be placed within a viewing port via an optical fiber access 470 located at end of the plasma source 400 opposite of the flange 430. FIG. 4B illustrates a view of this end that includes the optical fiber access. The optical fiber can provide optical signals to a spectrometer, such as spectrometer 160 in FIG. 1 and FIG. 2.

Figure 5:
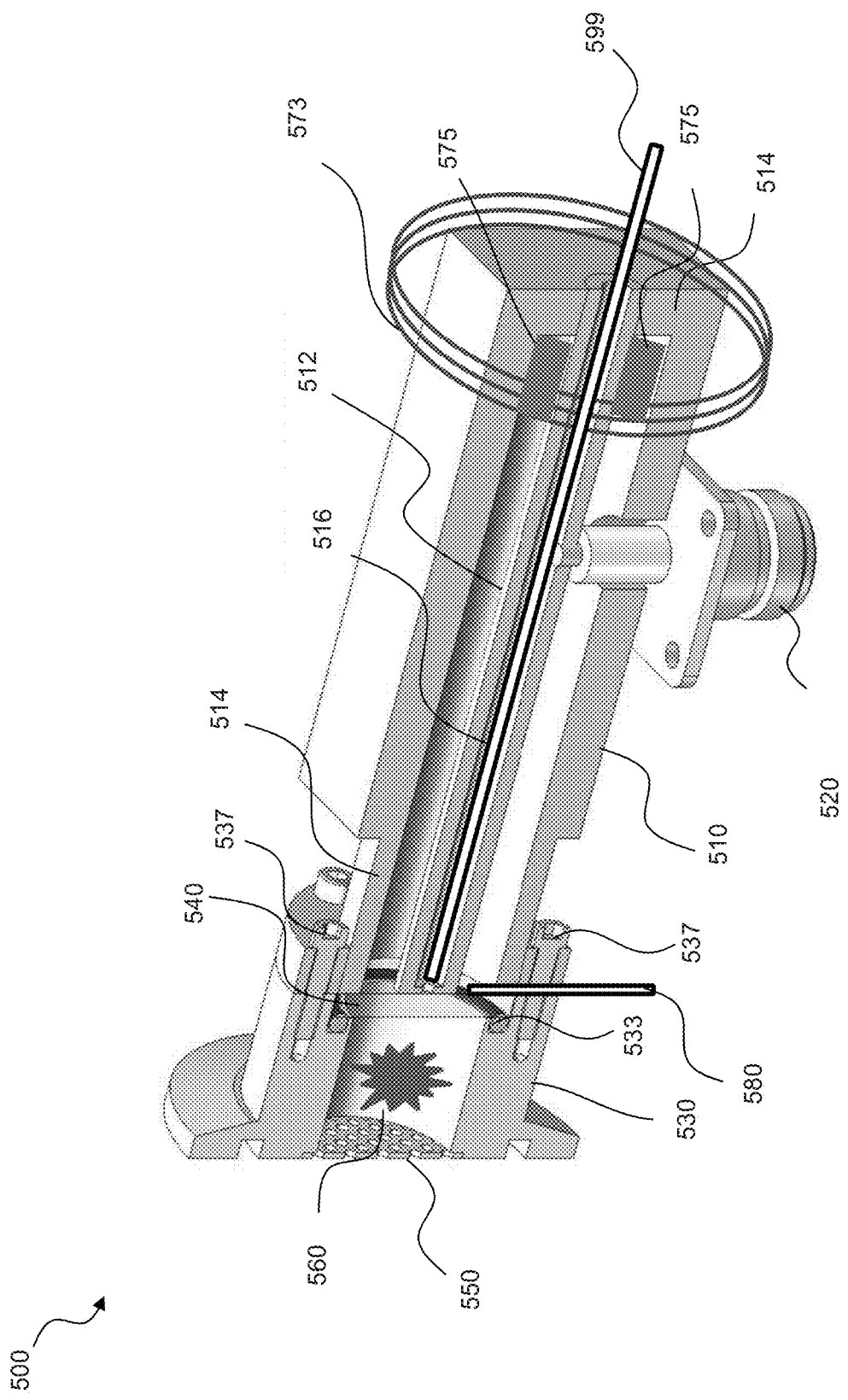
FIG. 5 illustrates a cutaway view diagram of an embodiment of a plasma source constructed according to the principles of the disclosure.

FIG. 5 illustrates another diagram of an embodiment of a plasma source 500 constructed according to the principles of the disclosure. Similar to the plasma source 400 in FIG. 4, the plasma source 500 includes a coaxial RF resonator 510, an RF interface 520, a flange 530, a window 540, an isolation screen 550, and a plasma cavity 560. An o-ring 533 and screws or bolts 537 are also illustrated. The plasma source 500 is presented in a cutaway view in FIG. 5 that illustrates an inner electrode 512 and an outer electrode 514 of the coaxial RF resonator 510. A viewing port 516 is also visible. In this embodiment components of an example of a Q tuner and a spark igniter 580 are also illustrated.

The coaxial RF resonator 510 includes the outer electrode 514 and the inner electrode 512 surrounded by and separated from the outer electrode 514. The RF interface 520 is electrically coupled to the inner electrode 512 and the outer electrode 514 and configured to provide an RF signal to the coaxial RF resonator 510.

An optical fiber 599 is shown within the viewing port 516 that extends along a length of the coaxial RF resonator 510 for optical monitoring. The viewing port 516 can be through the inner electrode 512 of the coaxial RF resonator 510 as illustrated. The viewing port 516 can be a volume within and defined by the inner electrode 512 and conveniently allows viewing access to the surface of the window 540 directly opposite the plasma volume. The optical fiber 599 can be coupled to a spectrometer for monitoring of the optical emission signals for determining the status of, for example, an ongoing semiconductor process within a process chamber.

During operation, the plasma source 500 is designed to have a low Q to reduce the influence of changes in the pressure and process gas within the process space. The Q tuner can be used to control the Q of the plasma source 500. The Q of the coaxial RF resonator 510 can be increased to intensify the EM field for ignition and then reduced after ignition. The Q tuner can be used to increase the Q of the coaxial RF resonator 510 to intensify the EM field for ignition of a plasma volume within the plasma cavity 560, and then reduced after the ignition. The changing of the Q can be done, for example, by energizing an electrical coil 573 of the Q tuner that is positioned around a portion of the plasma source 500 that contains an element 575 of the Q tuner that has a variable permittivity or permeability material, such as ferrite. A controller, such as the source controller 177, can automatically apply current to the electrical coil 573 during ignition and adjust the current after ignition to alter the cavity Q. The spark igniter 580 can also be used to ignite the plasma. Thus, ignition of the process gas can be performed in various ways using the disclosed plasma source 500.

The spark igniter 580 is proximate the window 540, shown opposite the process side in FIG. 5, and can be used for the initial plasma ignition. For example, a 15,000 volt spark igniter may be employed. The spark igniter 580 can be a conventional spark igniter, such as an AC or DC input electronic spark module that, for example, can be used for gas ignition. The spark igniter 580 can be manually controlled or operated by a controller, such as the source controller.

The above-described apparatuses, systems or methods or at least a portion thereof may be embodied in or performed by various processors (such as the controllers and computers of FIG. 2), such as digital data processors or computers, wherein the processors are programmed or store executable programs or sequences of software instructions to perform one or more of the steps of the methods or functions of the apparatuses or systems. The software instructions of such programs may represent algorithms and be encoded in machine-executable form on non-transitory digital data storage media, e.g., magnetic or optical disks, random-access memory (RAM), magnetic hard disks, flash memories, and/ or read-only memory (ROM), to enable various types of digital data processors or computers to perform one, multiple or all of the steps of one or more of the above-described methods or functions of the system described herein.

Certain embodiments disclosed herein may further relate to computer storage products with a non-transitory computer-readable medium that have program code thereon for performing various computer-implemented operations that embody at least part of the apparatuses, the systems or carry out or direct at least some of the steps of the methods set forth herein. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

Various aspects of the disclosure can be claimed including the systems and methods as disclosed herein. Aspects disclosed herein include:

A. A plasma source for excitation of a plasma from one or more gasses and optical monitoring thereof, the plasma source including: (1) a coaxial radio frequency (RF) resonator including a first end, a second end, an inner electrode and an outer electrode, (2) a radio frequency interface electrically coupled to the inner and outer electrode and configured to provide an RF signal to the coaxial RF resonator, (3) a flange positioned at the first end of the resonator and defining a plasma cavity, and (4) a window positioned between the first end of the resonator and the flange, and forming one side of the plasma cavity, whereby the coaxial RF resonator is isolated from the plasma.

B. An excitation system for excitation of a plasma, including: (1) a plasma source, having (1A) a coaxial radio frequency (RF) resonator including a first end, a second end, an inner electrode and an outer electrode, (1B) a radio frequency interface electrically coupled to the inner and outer electrode and configured to deliver an RF signal to the coaxial RF resonator, (1C) a flange positioned at the first end of the coaxial RF resonator and defining a plasma cavity, and (1D) a window positioned between the first end of the coaxial RF resonator and the flange, and forming one side of the plasma cavity, whereby the coaxial RF resonator is isolated from the plasma, and (2) a source controller configured to provide the RF signal to the RF interface and control an amount of power of the RF signal.

C. A method of operating an excitation measurement system, including: (1) igniting a plasma, from one or more gasses within a process chamber, within a plasma cavity of a plasma source, (2) maintaining the ignited plasma as an excited plasma, and (3) collecting optical signals from the excited plasma for processing.

Each of the aspects A, B, and C may have one or more of the following additional elements in combination:

Element 1: further comprising an isolation screen positioned at an opposite end of the plasma cavity from the window and forming a second side of the plasma cavity. Element 2: further comprising an o-ring positioned between the window and the flange. Element 3: wherein the flange is removably coupled to the coaxial RF resonator. Element 4: further comprising a viewing port extending along a length of the coaxial RF resonator between the first and second end. Element 5: further comprising an optical fiber access located at the second end of the coaxial RF resonator and coinciding with the viewing port. Element 6: wherein an inner surface of the flange that defines the plasma cavity is coated with a product that resists contamination and damage due to the plasma. Element 7: further comprising an igniter for ignition of plasma within the plasma cavity. Element 8: wherein the igniter is a spark igniter located proximate the window outside of the plasma cavity. Element 9: further comprising a Q tuner configured to alter the Q of the plasma source. Element 10: wherein the Q tuner includes an electrical coil proximate the coaxial RF resonator and a ferrite element between the inner and outer electrodes, wherein the electrical coil is positioned around a portion of the coaxial RF resonator having the ferrite element. Element 11: wherein excitation of the coaxial RF resonator is provided by the RF signal via the RF interface and an electromagnetic field is generated and delivered to the plasma cavity for the excitation of the plasma. Element 12: wherein the window is self-cleaning. Element 13: wherein the source controller alters the amount of power based on igniting of the plasma or maintaining the plasma after igniting. Element 14: wherein the source controller uses an amount of power for maintaining that is an order smaller than an amount used for igniting. Element 15: wherein the source controller automatically controls the amount of power. Element 16: wherein the source controller automatically controls a frequency of the RF signal. Element 17: wherein the plasma source further comprises a Q tuner and the source controller varies an amount of current supplied to the Q tuner for igniting the plasma and maintaining the plasma. Element 18: wherein the source controller automatically controls the amount of current. Element 19: wherein the plasma is from one or more gasses within a process chamber and the plasma source is physically coupled to the process chamber. Element 20: wherein the source controller is configured to receive process information about a process in the process chamber and alter at least one of the amount of power and the RF frequency based on the process information. Element 21: wherein the plasma source is a source of light for optical monitoring and the excitation system includes at least one other optical interface for optical monitoring. Element 22: further comprising receiving an operational mode and parameters for the process chamber and performing the igniting and exciting based thereon. Element 23: further comprising altering a power level or frequency of an RF signal for performing the igniting and the maintaining. Element 24: further comprising altering the Q of the plasma cavity for performing the igniting and the maintaining. Element 25: wherein the igniting is performed by an EM field generated by the plasma source from a received RF signal. Element 26: wherein the plasma source is a first optical source and the method further comprises collecting different optical signals from a second optical source that is different than the plasma source. Element 27: wherein the second optical source is another plasma source.

The invention claimed is:

1. A plasma source for excitation of a plasma from one or more gasses and optical monitoring thereof, the plasma source comprising:
   a coaxial radio frequency (RF) resonator including a first end, a second end, an inner electrode and an outer electrode;
   a radio frequency interface electrically coupled to the inner and outer electrode and configured to provide an RF signal to the coaxial RF resonator;
   a flange positioned at the first end of the resonator and defining a plasma cavity; and
   a window positioned between the first end of the resonator and the flange, and forming one side of the plasma cavity, whereby the coaxial RF resonator is isolated from the plasma.

2. The plasma source as recited in claim 1 further comprising an isolation screen positioned at an opposite end of the plasma cavity from the window and forming a second side of the plasma cavity.

3. The plasma source as recited in claim 1 further comprising an o-ring positioned between the window and the flange.

4. The plasma source as recited in claim 1 wherein the flange is removably coupled to the coaxial RF resonator.

5. The plasma source as recited in claim 1 further comprising a viewing port extending along a length of the coaxial RF resonator between the first and second end.

6. The plasma source as recited in claim 5 further comprising an optical fiber access located at the second end of the coaxial RF resonator and coinciding with the viewing port.

7. The plasma source as recited in claim 1 wherein an inner surface of the flange that defines the plasma cavity is coated with a product that resists contamination and damage due to the plasma.

8. The plasma source as recited in claim 1 further comprising an igniter for ignition of plasma within the plasma cavity.

9. The plasma source as recited in claim 8 wherein the igniter is a spark igniter located at the window outside of the plasma cavity.

10. The plasma source as recited in claim 1 further comprising a Q tuner configured to alter the Q of the plasma source.

11. The plasma source as recited in claim 10 wherein the Q tuner includes an electrical coil and a ferrite element between the inner and outer electrodes, wherein the electrical coil is positioned around a portion of the coaxial RF resonator having the ferrite element.

12. The plasma source as recited in claim 1 wherein excitation of the coaxial RF resonator is provided by the RF signal via the RF interface and an electromagnetic field is generated and delivered to the plasma cavity for the excitation of the plasma.

13. The plasma source as recited in claim 1 wherein the window is self-cleaning.

14. An excitation system for excitation of a plasma, comprising:
   a plasma source, including:
      a coaxial radio frequency (RF) resonator including a first end, a second end, an inner electrode and an outer electrode,
      a radio frequency interface electrically coupled to the inner and outer electrode and configured to deliver an RF signal to the coaxial RF resonator,
      a flange positioned at the first end of the coaxial RF resonator and defining a plasma cavity, and
      a window positioned between the first end of the coaxial RF resonator and the flange, and forming one side of the plasma cavity, whereby the coaxial RF resonator is isolated from the plasma; and
   a source controller configured to provide the RF signal to the RF interface and control an amount of power of the RF signal.

15. The excitation system as recited in claim 14 wherein the source controller alters the amount of power based on igniting of the plasma or maintaining the plasma after igniting.

16. The excitation system as recited in claim 15 wherein the source controller uses an amount of power for maintaining that is an order smaller than an amount used for igniting.

17. The excitation system as recited in claim 15 wherein the source controller automatically controls the amount of power.

18. The excitation system as recited in claim 14 wherein the source controller automatically controls a frequency of the RF signal.

19. The excitation system as recited in claim 14 wherein the plasma source further comprises a Q tuner and the source controller varies an amount of current supplied to the Q tuner for igniting the plasma and maintaining the plasma.

20. The excitation system as recited in claim 19 wherein the source controller automatically controls the amount of current.

21. The excitation system as recited in claim 14 wherein the plasma is from one or more gasses within a process chamber and the plasma source is physically coupled to the process chamber.

22. The excitation system as recited in claim 21 wherein the source controller is configured to receive process information about a process in the process chamber and alter at least one of the amount of power and frequency of the RF signal based on the process information.

23. The excitation system as recited in claim 14 wherein the plasma source is a source of light for optical monitoring and the excitation system includes at least one other optical interface for optical monitoring.

* * * * *